(12) United States Patent
Ko et al.

(10) Patent No.: US 10,319,590 B2
(45) Date of Patent: Jun. 11, 2019

(54) METHOD OF FORMING SEMICONDUCTOR DEVICE USING METAL-CONTAINING HARDMASK TO PATTERN PHOTORESIST HAVING PROTECTED POLYMER

(71) Applicant: SAMSUNG ELECTRONICS CO., LTD., Suwon-si, Gyeonggi-do (KR)

(72) Inventors: Cha-won Ko, Yongin-si (KR);
Hyun-woo Kim, Seongnam-si (KR);
Youn-joung Cho, Hwaseong-si (KR);
Jin-kyu Han, Hwaseong-si (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 166 days.

(21) Appl. No.: 15/294,818

(22) Filed: Oct. 17, 2016

(65) Prior Publication Data

US 2017/0186614 A1    Jun. 29, 2017

(30) Foreign Application Priority Data

Dec. 23, 2015    (KR) .......................... 10-2015-0185024

(51) Int. Cl.
*H01L 21/033*    (2006.01)
*H01L 21/02*    (2006.01)
*H01L 21/027*    (2006.01)

(52) U.S. Cl.
CPC ...... *H01L 21/0337* (2013.01); *H01L 21/0228* (2013.01); *H01L 21/0231* (2013.01);
(Continued)

(58) Field of Classification Search
CPC .......... H01L 21/0337; H01L 21/02186; H01L 21/0228; H01L 21/0276; H01L 21/02118;
(Continued)

(56) References Cited

U.S. PATENT DOCUMENTS 5,407,782 A * 4/1995 Kobayashi .............. G03F 7/095
430/273.1
6,770,415 B2    8/2004 Lee et al.
(Continued)

FOREIGN PATENT DOCUMENTS

KR       2003-0058629 A     7/2003
KR       10-0781876 B1     12/2007
(Continued)

OTHER PUBLICATIONS

Chatzichristidi, M. et al. in "Strippable aqueous base developable negative photoresist for high aspect ratio micromachining" Microelectronic Engineering 61-62 (2002) 729-735 (Year: 2002).*

*Primary Examiner* — Michael Jung
(74) *Attorney, Agent, or Firm* — Lee & Morse, P.C.

(57) ABSTRACT

A method of forming a semiconductor device includes forming an etching layer on a substrate, forming a photoresist layer on the etching layer, forming an exposed area configured to define an unexposed area in the photoresist layer, forming a hardmask layer on the exposed area using a selective deposition process, partially removing the photoresist layer using the hardmask layer as an etch mask and forming a photoresist pattern, and etching the etching layer using the photoresist pattern as an etch mask and forming a fine pattern.

20 Claims, 9 Drawing Sheets

(52) U.S. Cl.
CPC .... *H01L 21/0276* (2013.01); *H01L 21/02118* (2013.01); *H01L 21/02186* (2013.01); *H01L 21/02304* (2013.01); *H01L 21/0332* (2013.01)

(58) Field of Classification Search
CPC ............. H01L 21/0332; H01L 21/0231; H01L 21/02304; G03F 7/16
See application file for complete search history.

(56) References Cited

U.S. PATENT DOCUMENTS

| | | | |
|---|---|---|---|
| 8,791,027 B2 | 7/2014 | Kofuji et al. | |
| 10,056,256 B2* | 8/2018 | Lai | G03F 7/20 |
| 2004/0081762 A1 | 4/2004 | Tsushima | |
| 2010/0248152 A1* | 9/2010 | Scheer | H01L 21/0332 430/311 |
| 2012/0064463 A1* | 3/2012 | Park | G03F 7/0392 430/326 |
| 2012/0164846 A1* | 6/2012 | Ha | H01L 21/02153 438/786 |
| 2013/0236837 A1 | 9/2013 | Honda et al. | |
| 2014/0346142 A1* | 11/2014 | Chapuis | C08J 7/02 216/51 |
| 2015/0087150 A1* | 3/2015 | Wang | H01L 21/3086 438/696 |

FOREIGN PATENT DOCUMENTS

| | | |
|---|---|---|
| KR | 10-2009-0072149 A | 7/2009 |
| KR | 10-2009-0102217 A | 9/2009 |

* cited by examiner

METHOD OF FORMING SEMICONDUCTOR DEVICE USING METAL-CONTAINING HARDMASK TO PATTERN PHOTORESIST HAVING PROTECTED POLYMER

CROSS-REFERENCE TO RELATED APPLICATION

Korean Patent Application No. 10-2015-0185024, filed on Dec. 23, 2015, in the Korean Intellectual Property Office, and entitled: "Method of Forming Semiconductor Device Using Selective Deposition Layer and Related Device," is incorporated by reference herein in its entirety.

BACKGROUND

1. Field

Embodiments relate to a method of forming a fine pattern using a selective deposition layer.

2. Description of the Related Art

According to high integration of the semiconductor device, a size of a fine pattern has gradually become smaller. In order to form a fine pattern, an aspect ratio of a photoresist pattern has been increased.

SUMMARY

Embodiments are directed to a method of forming a semiconductor device including forming an etching layer on a substrate, forming a photoresist layer on the etching layer; forming an exposed area configured to define an unexposed area in the photoresist layer, forming a hardmask layer on the exposed area using a selective deposition process, partially removing the photoresist layer using the hardmask layer as an etch mask and forming a photoresist pattern, and etching the etching layer using the photoresist pattern as an etch mask and forming a fine pattern.

Embodiments are also directed to a method of forming a semiconductor device including forming an etching layer on a substrate, forming a photoresist layer on the etching layer, forming an exposed area configured to define an unexposed area in the photoresist layer, forming a hardmask layer on the unexposed area using an selective deposition process, partially removing the photoresist layer using the hardmask layer as an etch mask and forming a photoresist pattern, etching the etching layer using the photoresist pattern as an etch mask and forming a fine pattern.

Embodiments are also directed to a method of forming a pattern including forming an etching layer on a substrate, forming a photoresist layer on the etching layer; wherein the photoresist layer includes one of a material that generates a hydroxyl group, a carboxylic acid group, or an amine group upon selective exposure to light and post-exposure baking and a material that includes a hydroxyl group, a carboxylic acid group, or an amine group and that loses the hydroxyl group, carboxylic acid group, or amine group by crosslinking upon selective exposure to light and post-exposure baking, selectively exposing the photoresist layer to light to define an exposed area and an unexposed area in the photoresist layer, forming a hardmask layer on the photoresist layer using a selective deposition process such that when the photoresist layer includes the material that generates a hydroxyl group, a carboxylic acid group, or an amine group upon selective exposure to light and post-exposure baking, the hardmask layer is formed on the exposed area, and when photoresist layer includes the material that includes a hydroxyl group, a carboxylic acid group, or an amine group and that loses the hydroxyl group, carboxylic acid group, or amine group by crosslinking upon selective exposure to light and post-exposure baking, the hardmask layer is formed on the unexposed area, partially removing the photoresist layer using the hardmask layer as an etch mask and forming a photoresist pattern, and etching the etching layer using the photoresist pattern as an etch mask and forming a fine pattern.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
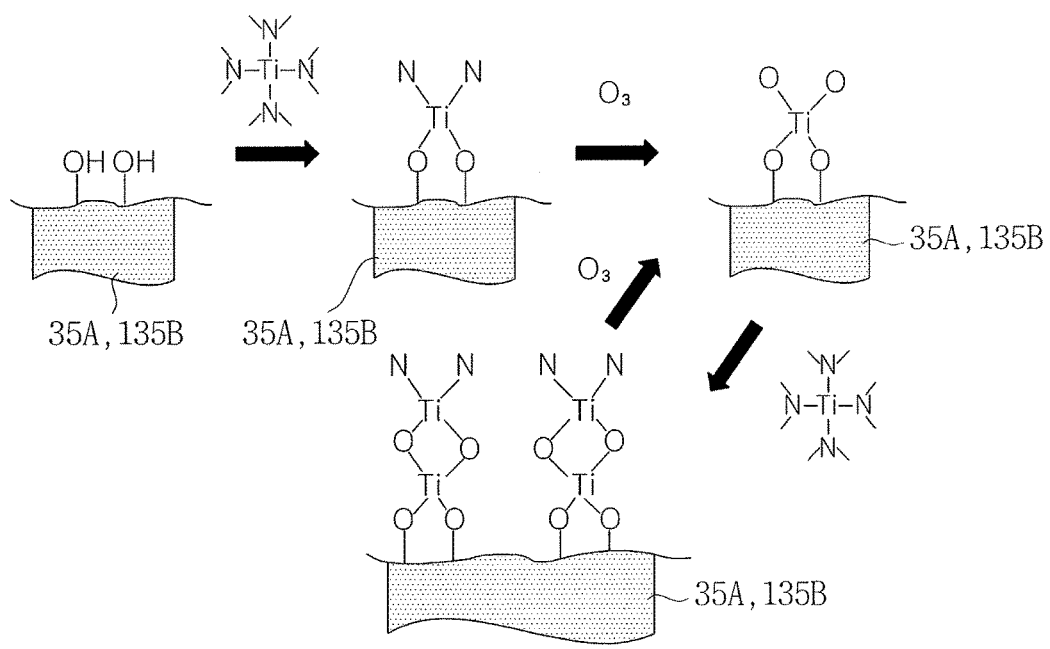
FIG. 1 illustrates a schematic drawing for describing a selective deposition process according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "between" two layers, it can be the only layer between the two layers, or one or more intervening layers may also be present. Like reference numerals refer to like elements throughout.

FIG. 1 illustrates a schematic drawing for describing a selective deposition process according to an embodiment.

Referring to FIG. 1, cleaning may be performed on a surface of an exposed area 35A or an unexposed area 135B having a hydroxyl group (—OH) using $N_2$ or Ar. Tetrakis-dimethyl-amino-titanium (TDMAT), i.e., $Ti[N(CH_3)_2]_4$, may be provided to the surface of the exposed area 35A or the unexposed area 135B. The hydroxyl group (—OH) and TDMAT may react on the surface of the exposed area 35A or the unexposed area 135B such that Ti may be selectively deposited on the surface. Ozone ($O_3$) may be provided to the exposed area 35A or the unexposed area 135B on which Ti is selectively deposited. Ti may combine with oxygen atoms (O), for example, oxygen atoms derived from the ozone, such that TiO may be formed. The cleaning, the provision of the TDMA, and the provision of the ozone ($O_3$) may be repetitively performed such that a TiO layer may be selectively formed on the surface of the exposed area 35A or unexposed area 135B. A cyclic deposition process or atomic layer deposition (ALD) process may be applied in the formation of the TiO layer.

Figure 4A:
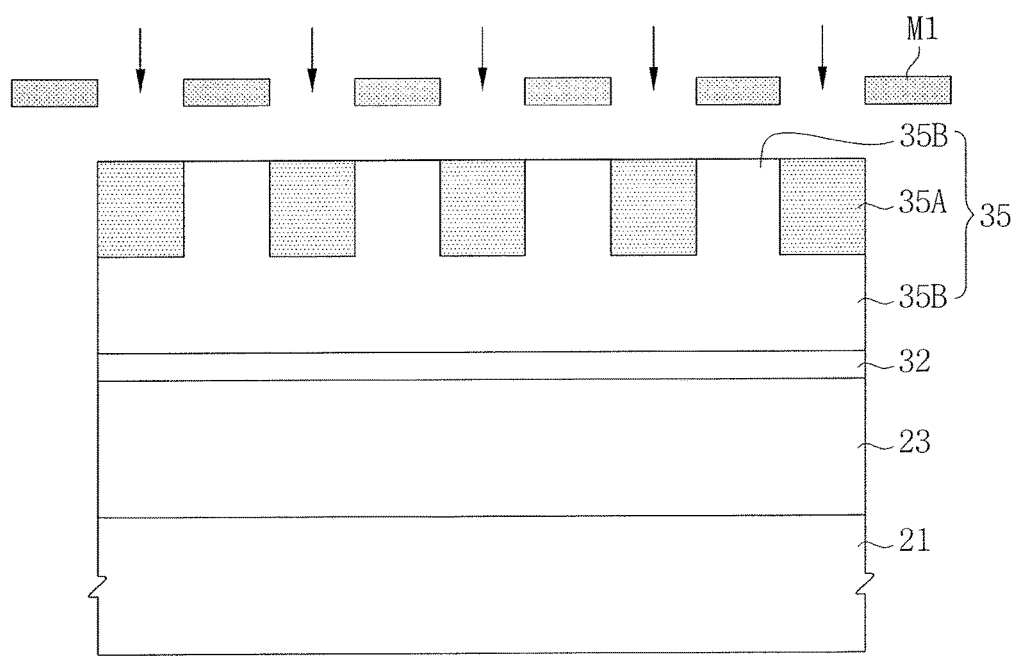
Figure 4B:
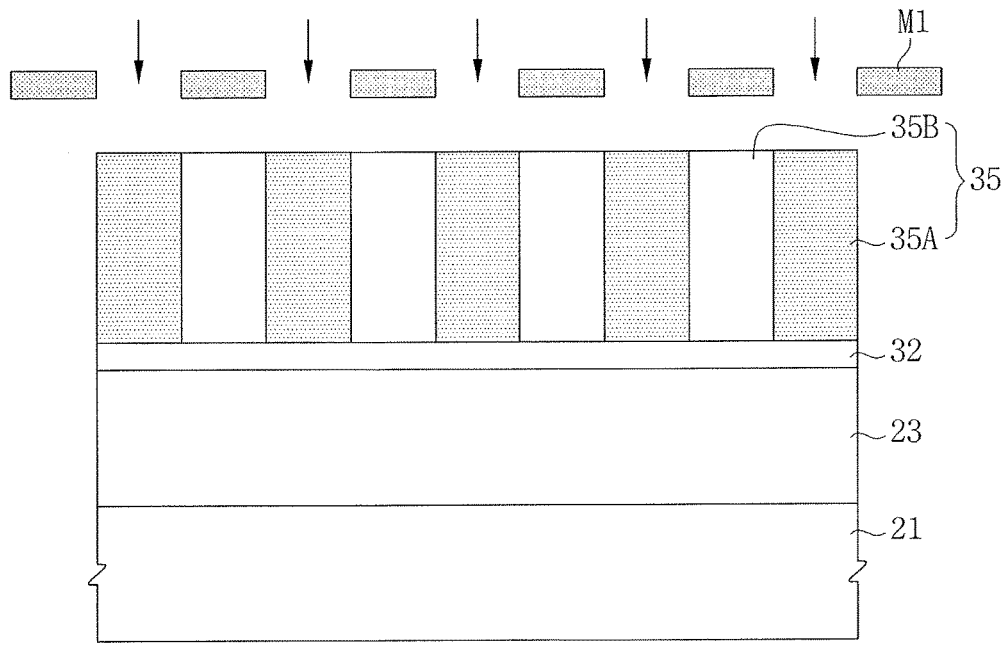
Figure 5:
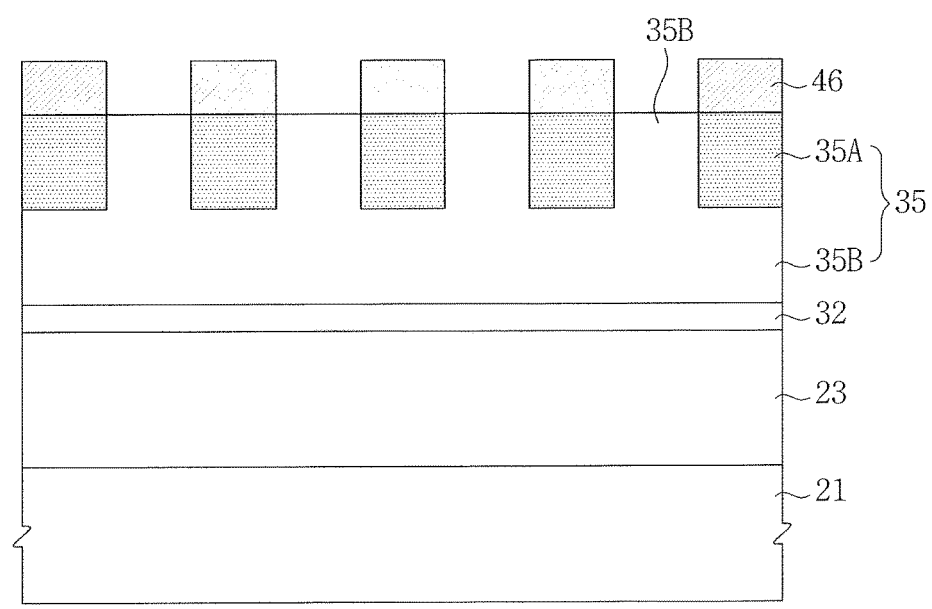
Figure 6A:
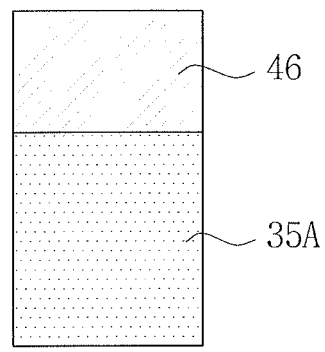
FIGS. 6A to 6C illustrate enlarged views illustrating a part of FIG. 5 in detail.
Figure 6B:
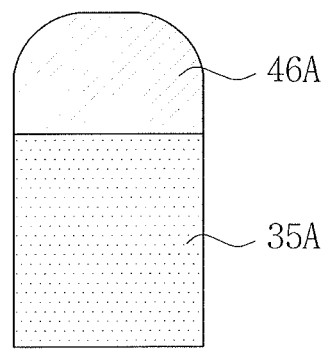
Figure 6C:
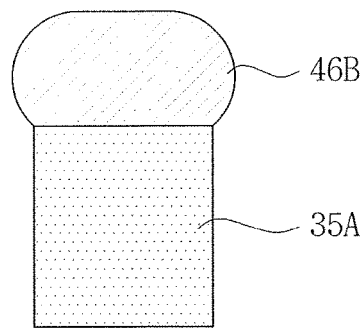

FIGS. 2 to 5 and 7A to 8 illustrate cross-sectional views for describing a method of forming a semiconductor device according to embodiments, and FIGS. 6A to 6C illustrate enlarged views depicting a part of FIG. 5 in detail.

Figure 2:
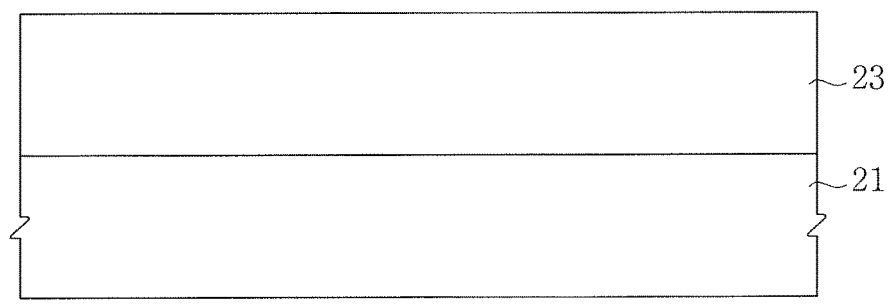
FIGS. 2 to 5 and 7A to 8 illustrate cross-sectional views for describing stages of a method of forming a semiconductor device according to an embodiment.

Referring to FIG. 2, an etching layer 23 may be formed on a substrate 21.

The substrate 21 may be a semiconductor substrate such as a silicon wafer or a silicon on insulator (SOI) wafer. The etching layer 23 may be a single layer or a multi-layer. The etching layer 23 may include a metal, a semiconductor, an oxide, a nitride, silicon oxide, silicon nitride, silicon oxy-nitride, or a combination thereof. For example, the etching layer 23 may include a spin on hardmask (SOH) layer and a silicon oxy-nitride layer formed on the SOH layer. An upper surface of the etching layer 23 may be planarized.

In some implementations, a plurality of active/passive devices may be formed inside the substrate 21 and between the substrate 21 and the etching layer 23.

Figure 3:
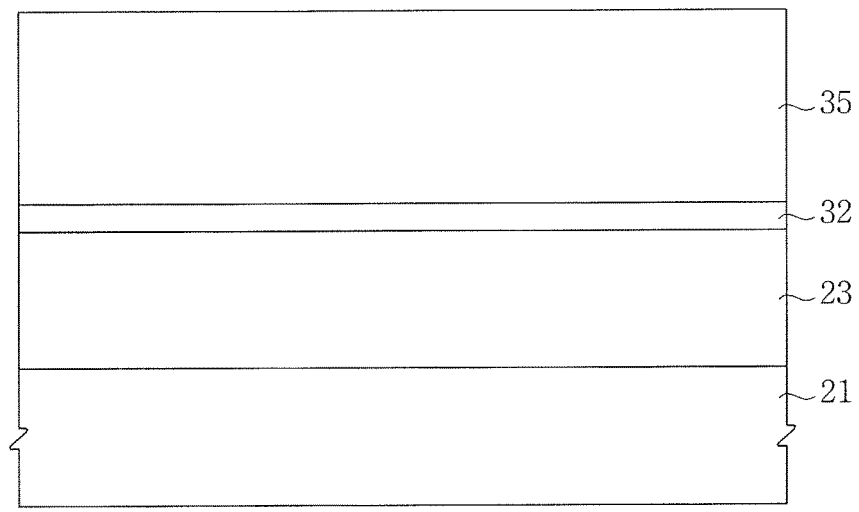

Referring to FIG. 3, an anti-reflective coating (ARC) layer 32 may be formed on the etching layer 23. A first photoresist layer 35 may be formed on the ARC layer 32. The first photoresist layer 35 may be baked using a softbake process.

The ARC layer 32 may completely cover the etching layer 23. The ARC layer 32 may be in direct contact with an upper surface of the etching layer 23. The ARC layer 32 may include an organic material or silicon.

The first photoresist layer 35 may completely cover a top of the etching layer 23. The ARC layer 32 may be interposed between the first photoresist layer 35 and the etching layer 23. The first photoresist layer 35 may include a material capable of generating a hydroxyl group (—OH), a carboxylic acid, or an amine group (—NH$_2$) upon selective exposure to light. The first photoresist layer 35 may include a photoacid generator (PAG).

For example, the first photoresist layer 35 may include a polymer having a protected polyhydroxy styrene (PHS) as represented by Chemical Formula 1 or a polymer having a protected methacrylic acid as represented by Chemical Formula 2.

Chemical Formula 1: a polymer having a PHS

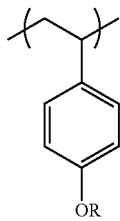

Chemical Formula 2: a polymer having a protected methacrylic acid

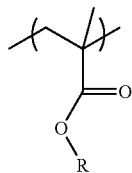

In Chemical Formula 1 and Chemical Formula 2, a protecting group R may contain 1 to 100 carbon atoms and may include an aliphatic unit, an alicyclic unit, or an aromatic unit.

For example, in Chemical Formula 1 and Chemical Formula 2, the protecting group R may include an acetal, a ketal, an ether, a tert-butoxycarbonyl (t-BOC) group, a tetrahydropyranyl group, a trimethylsilyl group, a phenoxyethyl group, a cyclohexenyl group, a t-BOC methyl group, a tert-butyl group, an adamantyl group, or a norbornyl group.

The PAG may include a chromophore group. When the PAG is exposed to one selected from an i-line, a KrF excimer laser (248 nm), an ArF excimer laser (193 nm), an F2 excimer laser (157 nm), EUV (13.5 nm), and an E-beam, the PAG may generate an acid. For example, the PAG may include an onium salt, a halogen compound, a nitrobenzyl ester, an alkyl sulfonate, a diazonaphthoquinone, an imino sulfonate, a disulfone, a diazomethane, or a sulfonyl oxyketone.

Referring to FIG. 4A, an exposed area 35A configured to define an unexposed area 35B in the first photoresist layer 35 may be formed using an exposure process. The exposed area 35A may be locally formed in the first photoresist layer 35. The unexposed area 35B may remain between the exposed area 35A and the ARC layer 32. A first reticle M1 may be applied in the exposure process. An i-line, a KrF excimer laser (248 nm), an ArF excimer laser (193 nm), an F2 excimer laser (157 nm), EUV (13.5 nm), or an E-beam may be applied in the exposure process.

The first photoresist layer 35 having the exposed area 35A and the unexposed area 35B may be baked using a post exposure bake (PEB) process. The PEB process may be performed for 30 seconds to 180 seconds at a temperature in a range of 50° C. to 250° C.

In an embodiment, a hydroxyl group (—OH) may be selectively generated on the surface of the exposed area 35A during the exposure process and the PEB process.

In an embodiment, a carboxylic acid may be selectively generated on the surface of the exposed area 35A during the exposure process and the PEB process.

In an embodiment, an amine group (—NH$_2$) may be selectively generated on the surface of the exposed area 35A during the exposure process and the PEB process.

Referring to FIG. 4B, an exposed area 35A may completely penetrate from an upper surface to a bottom of a first photoresist layer 35. The exposed area 35A may be in direct contact with the ARC layer 32.

Referring to FIG. 5, a hardmask layer 46 may be formed on the exposed area 35A using a selective deposition process. The selective deposition process may include an ALD process or a cyclic deposition process. The hardmask layer 46 may include a material different from that of the first photoresist layer 35. The hardmask layer 46 may include a material having an etching selectivity with respect to the first photoresist layer 35. A thickness of the hardmask layer 46 may be less than that of the first photoresist layer 35. The hardmask layer 46 may include a metal oxide such as TiO or HfO.

In an embodiment, the hardmask layer 46 may include a metal nitride.

The hardmask layer 46 may be selectively formed on the exposed area 35A as described with reference to FIG. 1.

In an embodiment, cleaning may be performed on a surface of the first photoresist layer 35 having the exposed area 35A using N$_2$ or Ar. TDMAT may be provided on the surface of the first photoresist layer 35 having the exposed area 35A. A hydroxyl group (—OH) of the exposed area 35A may react with TDMAT such that Ti may be selectively deposited on the exposed area 35A. Ozone (O$_3$) may be provided to the exposed area 35A on which Ti is selectively deposited. Ti may combine with O such that TiO is formed on the exposed area 35A. The cleaning, the provision of the TDMAT, and the provision of ozone ($O_3$) may be repetitively performed, and the hardmask layer 46 may be selectively formed on the surface of the exposed area 35A. The hardmask layer 46 may include TiO, $TiO_2$, or $TiO_x$.

In an embodiment, cleaning may be performed on a surface of the first photoresist layer 35 having the exposed area 35A using $N_2$ or Ar. HfD-02 (bis(methylcyclopentadienyl)dimethylhafnium(IV):Hf[$C_5H_4(CH_3)$]$_2(CH_3)_2$) or HfD-04 (bis(methylcyclopentadienyl)methoxymethylhafnium(IV):Hf[$C_5H_4(CH_3)$]$_2(OCH_3)CH_3$) may be provided on the surface of the first photoresist layer 35 having the exposed area 35A. Hf may be selectively deposited on the exposed area 35A. Ozone ($O_3$) may be provided on the exposed area 35A on which Hf is selectively deposited. Hf may combine with O such that HfO is formed on the exposed area 35A. The cleaning, the provision of the Hf[$C_5H_4(CH_3)$]$_2(CH_3)_2$ or Hf[$C_5H_4(CH_3)$]$_2(OCH_3)CH_3$, and the provision of ozone ($O_3$) may be repetitively performed, and the hardmask layer 46 may be selectively formed on the surface of the exposed area 35A. The hardmask layer 46 may include HfO or $HfO_x$.

Referring to FIG. 6A, in some implementations, the hardmask layer 46 may be self-aligned on the exposed area 35A. The hardmask layer 46 may be vertically aligned on the exposed area 35A. The hardmask layer 46 may have a horizontal width substantially the same as the exposed area 35A. A side surface of the hardmask layer 46 may have substantially the same plane as a side surface of the exposed area 35A.

Referring to FIG. 6B, in some implementations, an upper edge of a hardmask layer 46A may be rounded.

Referring to FIG. 6C, in some implementations, a horizontal width of a hardmask layer 46B may be greater than that of the exposed area 35A. An upper edge of the hardmask layer 46B may be rounded.

Figure 7A:
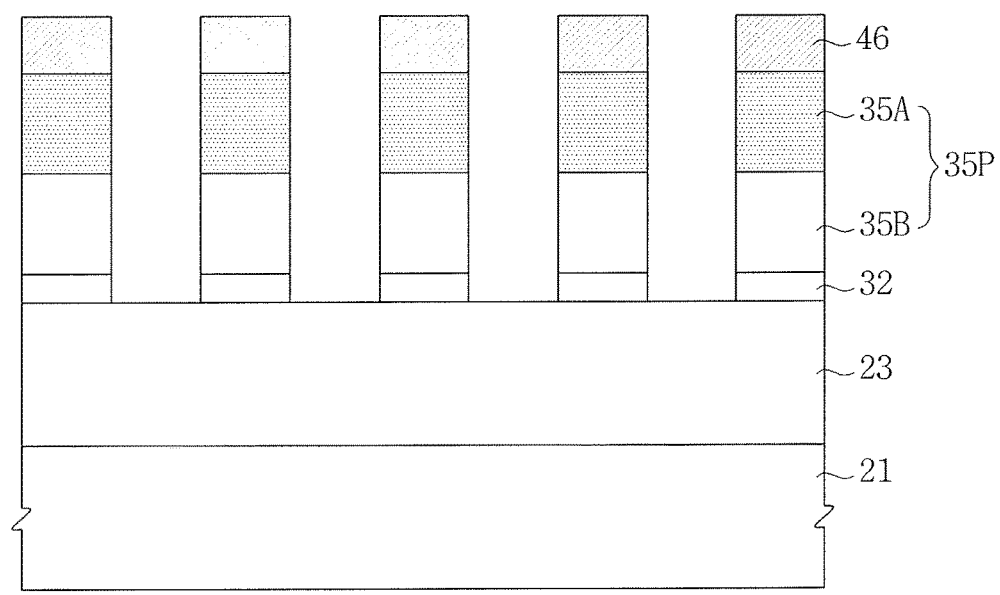

Referring to FIG. 7A, a first photoresist pattern 35P may be formed by using the hardmask layer 46 as an etch mask and performing a dry development process. The first photoresist pattern 35P may include the exposed area 35A. In a case where the exposed area 35A was formed to not completely penetrate from an upper surface to a bottom of a first photoresist layer, as shown in FIG. 4A, the first photoresist pattern 35P may include the exposed area 35A and the portion of the unexposed area 35B underneath the exposed area. The first photoresist pattern 35P may have an aspect ratio of at least 2:1. A vertical height of the first photoresist pattern 35P may be two to one hundred times greater than a horizontal width of the first photoresist pattern 35P.

The ARC layer 32 may remain at a bottom of the first photoresist pattern 35P.

A fluorine based or oxygen based etching gas may be used in the dry development process.

Figure 7B:
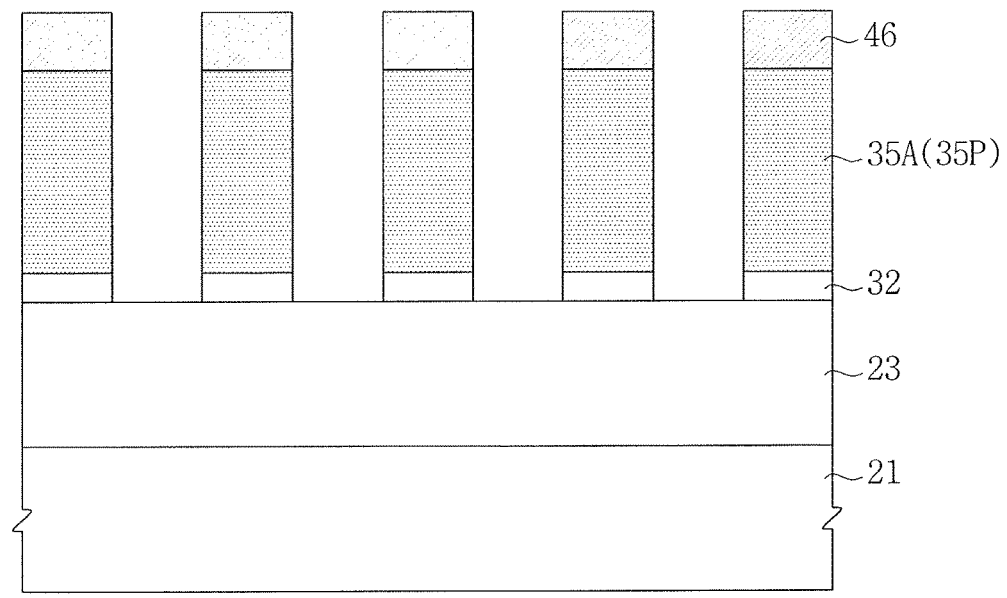

Referring to FIG. 7B, in a case where the exposed area 35A was formed to completely penetrates from an upper surface to a bottom of a first photoresist layer, as shown in FIG. 4B, a first photoresist pattern 35P may include an exposed area 35A that is in direct contact with the ARC layer 32. The ARC layer 32 may remain between the exposed area 35A and the etching layer 23.

Figure 8:
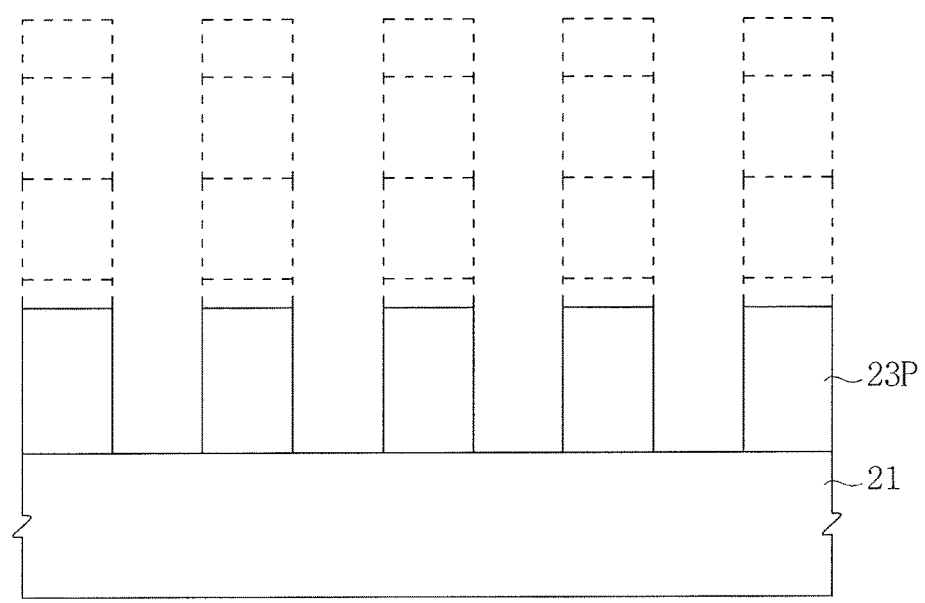

Referring to FIG. 8, a fine pattern 23P may be formed by using the first photoresist pattern 35P as an etch mask and etching the etching layer 23. An anisotropic etching process may be applied in the formation of the fine pattern 23P. The fine pattern 23P may be exposed by removing the hardmask layer 46, the first photoresist pattern 35P, and the ARC layer 32.

FIGS. 9 to 13 are cross-sectional views for describing stages of a method of forming a semiconductor device according to embodiments.

Figure 9:
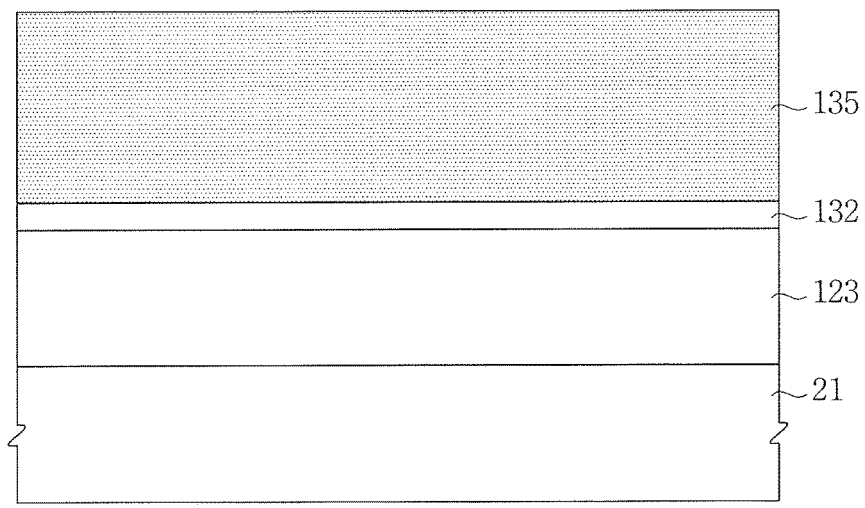
FIGS. 9 to 13 illustrate cross-sectional views for describing stages of a method of forming a semiconductor device according to an embodiment.

Referring to FIG. 9, an etching layer 123, an ARC layer 132, and a second photoresist layer 135 may be formed on a substrate 21. The second photoresist layer 135 may include a material having a hydroxyl group (—OH), a carboxylic acid, or an amine group (—$NH_2$) on a surface. The second photoresist layer 135 may be baked using a softbake process.

For example, the second photoresist layer 135 may include a polymer having a PHS, a PAG, and a crosslinker.

The PAG may include a chromophore group. When the PAG is exposed to one selected from a group consisting of an i-line, a KrF excimer laser (248 nm), an ArF excimer laser (193 nm), an F2 excimer laser (157 nm), EUV (13.5 nm), and an E-beam, the PAG may generate an acid. The PAG may include an onium salt, a halogen compound, a nitrobenzyl ester, an alkyl sulfonate, a diazonaphthoquinone, an imino sulfonate, a disulfone, a diazomethane, or a sulfonyl oxyketone.

The crosslinker may include a hydrocarbon compound having 4 to 50 carbon atoms and having two or more double bonds at an end. The crosslinker may include an epoxy compound, a melamine compound, a guanamine compound, a glycoluril compound substituted with at least one selected from a group consisting of a methylol group, an alkoxymethyl group, and an acyloxymethyl group, or a compound having a double bond such as a urea compound, an isocyanate compound, an azide compound, and an alkenyl ether group. For example, the crosslinker may include alkoxymethyl glycoluril or alkoxymethyl melamine.

The epoxy compound may include tris(2,3-epoxypropyl) isocyanurate, trimethylolmethane triglycidyl ether, trimethylolpropane triglycidyl ether, or trimethylolethane triglycidyl ether.

The melamine compound may include hexamethylolmelamine, hexamethoxymethylmelamine, a compound having one to six methylol groups of methoxymethylated hexamethylolmelamine or a mixture thereof, hexamethoxyethylmelamine, hexaacyloxymethylmelamine, and a compound having one to six methylol groups of acyloxymethylated hexamethylolmelamine or a mixture thereof.

The guanamine compound may include tetramethylolguanamine, tetramethoxymethylguanamine, a compound having one to four methylol groups of methoxymethylated tetramethylolguanamine or a mixture thereof, tetramethoxyethylguanamine, tetraacyloxyguanamine, and a compound having one to four methylol groups of acyloxymethylated tetramethylolguanamine or a mixture thereof.

The glycoluril compound may include tetramethylolglycoluril, tetramethoxyglycoluril, tetramethoxymethyl glycoluril, a compound having one to four methylol groups of methoxymethylated tetramethylolglycoluril or a mixture thereof, and a compound having one to four methylol groups of acyloxymethylated tetramethylolglycoluril or a mixture thereof.

The urea compound may include tetramethylolurea, tetramethoxymethylurea, a compound having one to four methylol groups of methoxymethylated tetramethylolurea or a mixture thereof, and tetramethoxyethylurea.

The isocyanate compound may include tolylene diisocyanate, diphenylmethane diisocyanate, hexamethylene diisocyanate, and cyclohexane diisocyanate.

The azide compound may include 1,1'-biphenyl-4,4'-bisazide, 4,4'-methylidene bisazide, and 4,4'-oxybisazide.

The compound having the alkenyl ether group may include ethylene glycol divinyl ether, triethylene glycol divinyl ether, 1,2-propanediol divinyl ether, 1,4-butanediol divinyl ether, tetramethylene glycol divinyl ether, neopentyl glycol ether, trimethylolpropane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylolpropane trivinyl ether.

Figure 10A:
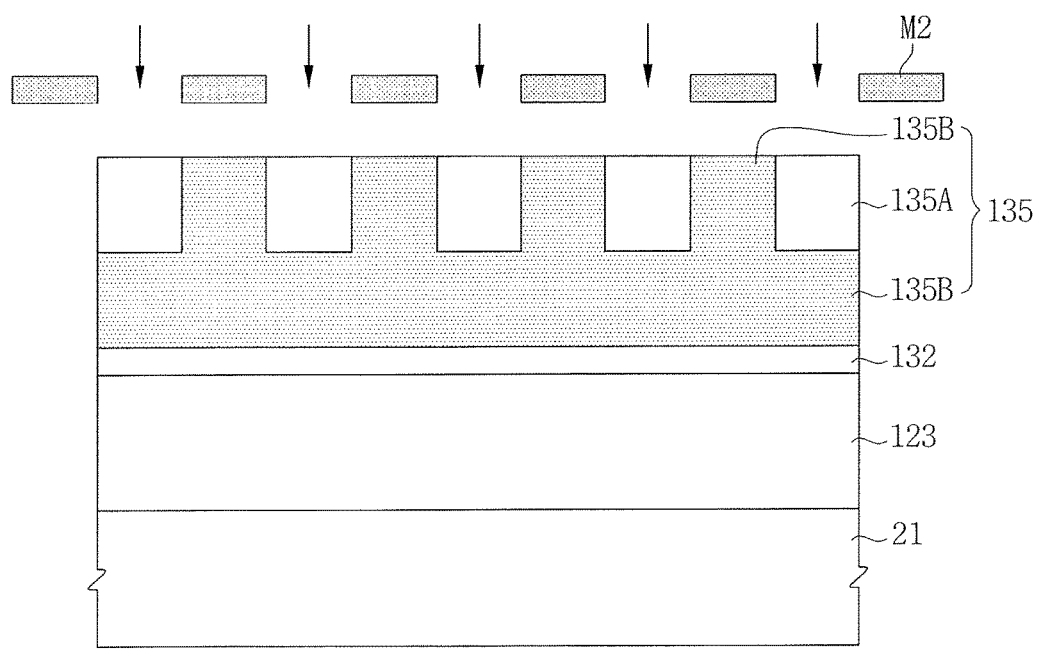

Referring to FIG. 10A, an exposed area 135A configured to define an unexposed area 135B in the second photoresist layer 135 may be formed using an exposure process. A second reticle M2 may be applied in the exposure process. An i-line, a KrF excimer laser (248 nm), an ArF excimer laser (193 nm), an F2 excimer laser (157 nm), EUV (13.5 nm), or an E-beam may be applied in the exposure process. The second photoresist layer 135 having the exposed area 135A and the unexposed area 135B may be baked using a PEB process. The PEB process may be performed for 30 seconds to 180 seconds at a temperature in a range of 50° C. to 250° C.

In an embodiment, during the exposure process and the PEB process, a hydroxyl group (—OH) of the exposed area 135A may be removed due to the influence of the PAG and the crosslinker. After the exposure process and the PEB process, a hydroxyl group (—OH) may selectively remain on a surface of the unexposed area 135B.

In an embodiment, after the exposure process and the PEB process, a carboxylic acid may selectively remain on the surface of the unexposed area 135B.

In an embodiment, after the exposure process and the PEB process, an amine group (—NH$_2$) may selectively remain on the surface of the unexposed area 135B.

Figure 10B:
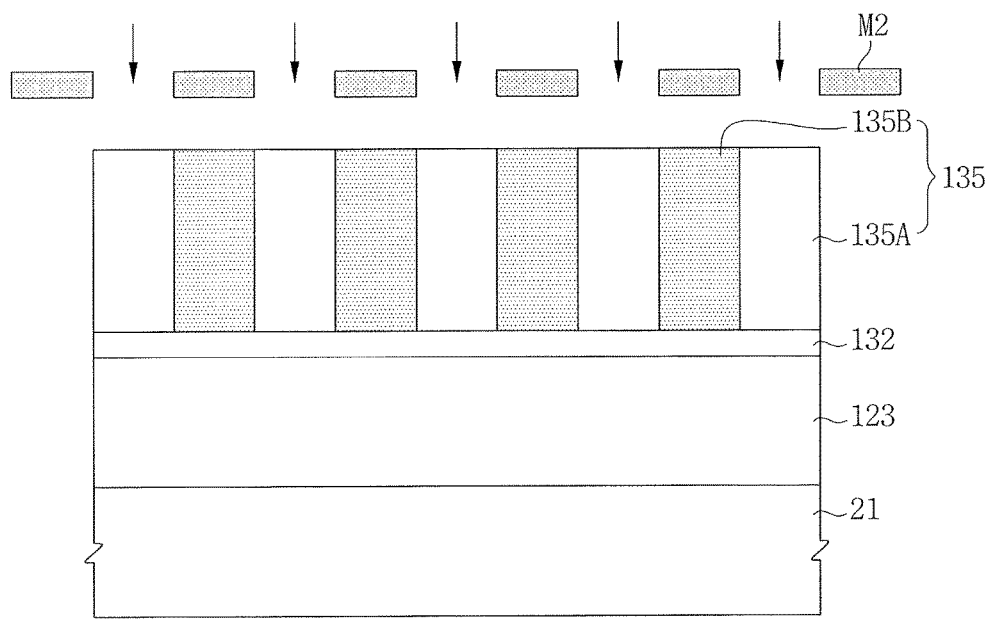

Referring to FIG. 10B, an exposed area 135A may completely penetrate from an upper surface to a bottom of a second photoresist layer 135. The exposed area 135A may be in direct contact with the ARC layer 132.

Figure 11:
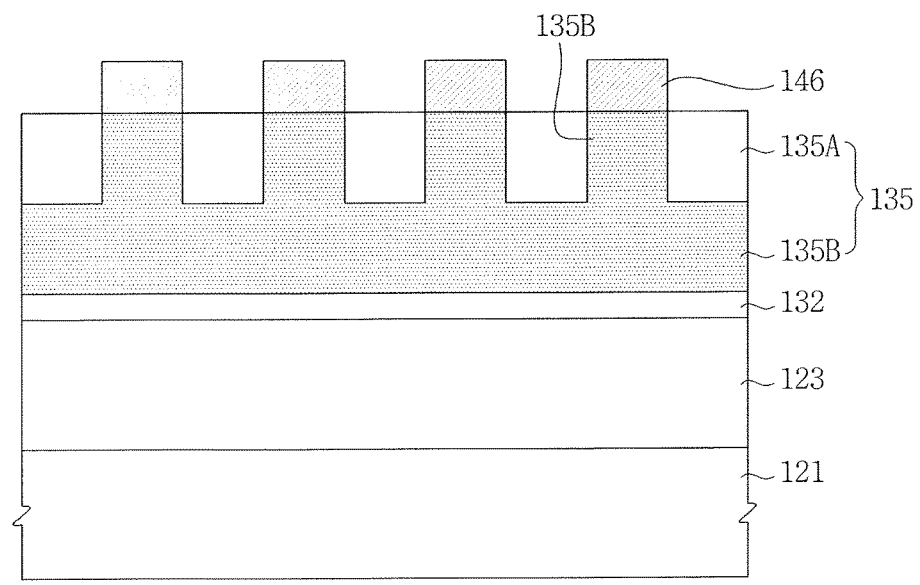

Referring to FIG. 11, a hardmask layer 146 may be formed on the unexposed area 135B using a selective deposition process. The selective deposition process may include an ALD process or cyclic deposition process. The hardmask layer 146 may include a material different from that of the second photoresist layer 135. The hardmask layer 146 may include a material having an etching selectivity with respect to the second photoresist layer 135. A thickness of the hardmask layer 146 may be less than that of the second photoresist layer 135. The hardmask layer 146 may include a metal oxide such as TiO or HfO.

In an embodiment, the hardmask layer 146 may include a metal nitride.

The hardmask layer 146 may be formed using a similar method as described with reference to FIGS. 1 and 5. The hardmask layer 146 may be selectively formed on the unexposed area 135B.

Figure 12:
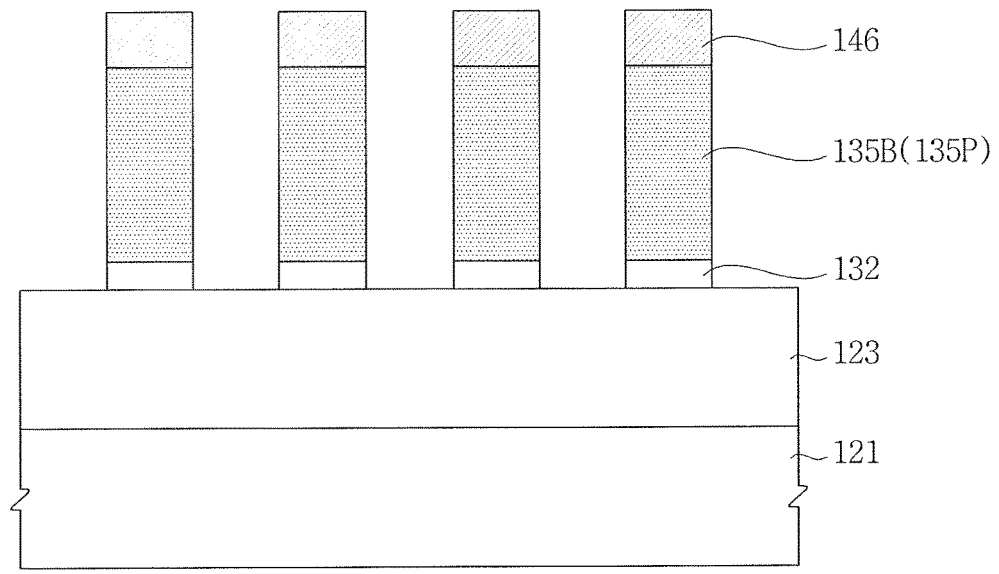

Referring to FIG. 12, a second photoresist pattern 135P may be formed by using the hardmask layer 146 as an etch mask and performing a dry development process. The second photoresist pattern 135P may include the unexposed area 135B. The second photoresist pattern 135P may have an aspect ratio of at least 2:1. A vertical height of the second photoresist pattern 135P may be two to one hundred times greater than a horizontal width of the second photoresist pattern 135P.

The ARC layer 132 may remain at a bottom of the second photoresist pattern 135P.

A fluorine based or oxygen based etching gas may be used in the dry development process.

Figure 13:
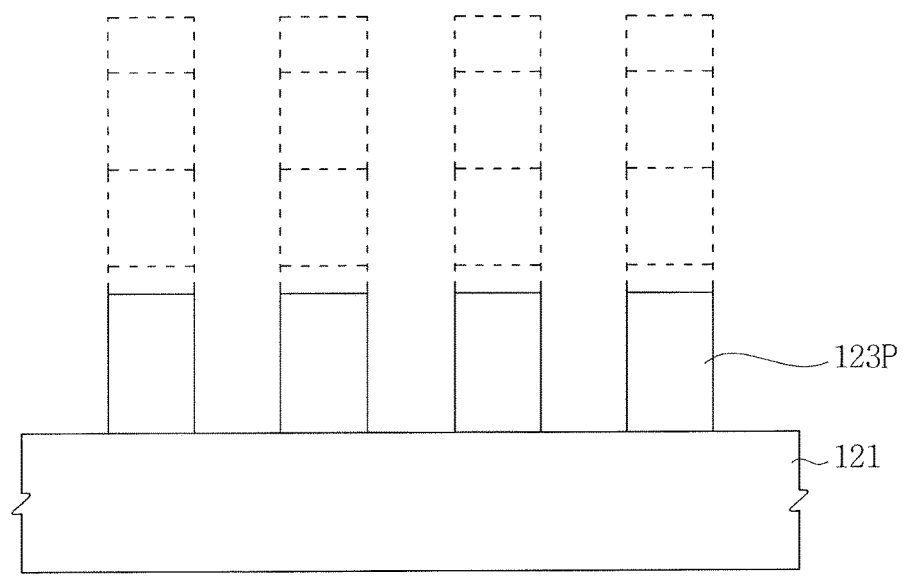

Referring to FIG. 13, a fine pattern 123P may be formed by using the second photoresist pattern 135P as an etch mask and etching the etching layer 123.

Experiment Example 1

A semiconductor device may be formed by a method described with reference to FIGS. 1 to 8.

Referring again to FIG. 2, the etching layer 23 may be formed on the substrate 21. The etching layer 23 may include an SOH layer having a thickness of around 180 nm and a SiON layer that is formed on the SOH layer and has a thickness of around 30 nm.

Referring again to FIG. 3, the ARC layer 32 and the first photoresist layer 35 may be formed on the etching layer 23. The first photoresist layer 35 may be formed to have a thickness of around 40 nm. The first photoresist layer 35 may include a polymer having a protected PHS and a PAG. A protecting group R of the polymer may include an adamantyl group.

Referring again to FIGS. 4A and 4B, the exposed area 35A configured to define the unexposed area 35B in the first photoresist layer 35 may be formed using an EUV lithography technique. A horizontal width of the exposed area 35A may be around 20 nm. The first photoresist layer 35 having the exposed area 35A and the unexposed area 35B may be baked using a PEB process.

Referring again to FIG. 5, the hardmask layer 46 may be formed on the exposed area 35A using a selective deposition process. The hardmask layer 46 may be used in an ALD process, and may be used with TDMAT and ozone (O$_3$). The hardmask layer 46 may include a TiO$_x$ layer having a thickness of around 5 nm.

Referring again to FIGS. 7A and 7B, the first photoresist pattern 35P may be formed by using the hardmask layer 46 as an etch mask and performing a dry development process. A horizontal width of the first photoresist pattern 35P may be around 20 nm. A vertical height of the first photoresist pattern 35P may be around 40 nm. The ARC layer 32 may remain at a bottom of the first photoresist pattern 35P.

Referring again to FIG. 8, the fine pattern 23P may be formed by using the first photoresist pattern 35P as an etch mask and etching the etching layer 23.

Experiment Example 2

A semiconductor device may be formed by a method similar to that described with reference to FIGS. 1 and 9 to 13.

Referring again to FIG. 9, the etching layer 123, the ARC layer 132, and the second photoresist layer 135 may be formed on the substrate 21. The second photoresist layer 135 may be formed to have a thickness of around 40 nm. The second photoresist layer 135 may include a polymer having a PHS, a PAG, and a crosslinker. The second photoresist layer 135 may be baked using a softbake process.

Referring again to FIGS. 10A and 10B, the exposed area 135A configured to define the unexposed area 135B in the second photoresist layer 135 may be formed using an exposure process. The second photoresist layer 135 having the exposed area 135A and the unexposed area 135B may be baked using a PEB process.

Referring again to FIG. 11, the hardmask layer 146 may be formed on the unexposed area 135B using a selective deposition process. The hardmask layer 146 may include a TiO$_x$ layer having a thickness of around 5 nm.

Referring again to FIG. 12, the second photoresist pattern 135P may be formed by using the hardmask layer 146 as an etch mask and performing a dry development process. A horizontal width of the second photoresist pattern 135P may be around 20 nm. A vertical height of the second photoresist pattern 135P may be around 40 nm.

Referring again to FIG. 13, the fine pattern 123P may be formed by using the second photoresist pattern 135P as an etch mask and etching the etching layer 123.

By way of summation and review, a photoresist pattern having a high aspect ratio may be very susceptible to collapsing such that a development process with the photoresist pattern having the high aspect ratio may be difficult.

According to embodiments, a hardmask layer is formed on a photoresist layer using a selective deposition process. A photoresist pattern is formed by using the hardmask layer as an etch mask and using a dry development process. A fine pattern may be implemented while preventing the collapse of the photoresist pattern.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. A method of forming a semiconductor device, the method comprising:
forming an etching layer on a substrate;
forming a photoresist layer on the etching layer;
selectively exposing the photoresist layer to light to define an exposed area and an unexposed area in the photoresist layer;
forming a hardmask layer including a metal oxide or a metal nitride on the photoresist layer, the photoresist layer being in a state of including the exposed area and the unexposed area, using a selective deposition process that forms the hardmask layer on the exposed area and does not form the hardmask layer on the unexposed area;
forming a photoresist pattern by removing at least a portion of the unexposed area of the photoresist layer using the hardmask layer as an etch mask, the photoresist pattern having the exposed area; and
etching the etching layer using the photoresist pattern as an etch mask and forming a fine pattern.

2. The method as claimed in claim 1, wherein the photoresist layer includes a material capable of generating a hydroxyl group (—OH), a carboxylic acid, or an amine group (—NH$_2$) upon selective exposure to light.

3. The method as claimed in claim 1, wherein:
the photoresist layer includes a polymer represented by Chemical Formula 1 or a polymer represented by Chemical Formula 2, and a protecting group R in Chemical Formula 1 and Chemical Formula 2 contains 1 to 100 carbon atoms and includes an aliphatic unit, an alicyclic unit, or an aromatic unit:

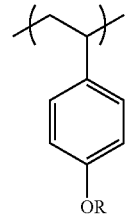

Chemical Formula 1

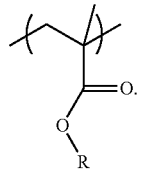

Chemical Formula 2

4. The method as claimed in claim 3, wherein the protecting group R includes an acetal, a ketal, an ether, a tert-butoxycarbonyl (t-BOC) group, a tetrahydropyranyl group, a trimethylsilyl group, a phenoxyethyl group, a cyclohexenyl group, a tert-butoxycarbonyl methyl group, a tert-butyl group, an adamantyl group, or a norbornyl group.

5. The method as claimed in claim 3, wherein the photoresist layer further includes a photoacid generator (PAG).

6. The method as claimed in claim 1, wherein:
the hardmask layer includes the metal oxide, and
the metal oxide is TiO or HfO.

7. The method as claimed in claim 1, wherein forming the photoresist pattern includes a dry development process.

8. The method as claimed in claim 1, wherein:
the hardmask layer includes the metal oxide, the metal oxide being TiO, and
forming the hardmask layer includes:
providing tetrakis-dimethyl-amino-titanium, to the photoresist layer having the exposed area, and
providing ozone (O$_3$) on the photoresist layer having the exposed area.

9. The method as claimed in claim 1, wherein:
the hardmask layer includes the metal oxide, the metal oxide being HfO, and
forming the hardmask layer includes:
providing Hf[C$_5$H$_4$(CH$_3$)]$_2$(CH$_3$)$_2$ or Hf[C$_5$H$_4$(CH$_3$)]$_2$(OCH$_3$)CH$_3$ to the photoresist layer having the exposed area, and
providing ozone (O$_3$) to the photoresist layer having the exposed area.

10. The method as claimed in claim 1, further comprising performing a post exposure bake process on the photoresist layer having the exposed area and the unexposed area before the hardmask layer is formed.

11. A method of forming a semiconductor device, the method comprising:
forming an etching layer on a substrate;
forming a photoresist layer on the etching layer;
selectively exposing the photoresist layer to light to define an exposed area and an unexposed area in the photoresist layer;
forming a hardmask layer including a metal oxide or metal nitride on the photoresist layer, the photoresist layer being in a state of including the exposed area and the unexposed area, using a selective deposition process that forms the hardmask layer on the unexposed area and does not form the hardmask layer on the exposed area;

forming a photoresist pattern by removing the exposed area of the photoresist layer using the hardmask layer as an etch mask the photoresist pattern having at least a portion of the unexposed area; and etching the etching layer using the photoresist pattern as an etch mask and forming a fine pattern, wherein forming the hardmask layer is performed prior to forming the photoresist pattern.

12. The method as claimed in claim 11, wherein the photoresist layer includes a material having a hydroxyl group (—OH), a carboxylic acid, or an amine group (—$NH_2$).

13. The method as claimed in claim 11, wherein the photoresist layer includes a polymer having a protected polyhydroxy styrene (PHS), a photoacid generator (PAG), and a crosslinker.

14. The method as claimed in claim 13, wherein the crosslinker includes an epoxy compound, a melamine compound, a guanamine compound, a glycoluril compound substituted with at least one selected from a methylol group, an alkoxymethyl group, and an acyloxymethyl group, a urea compound, an epoxy compound, an isocyanate compound, an azide compound, or an compound having an alkenyl ether group.

15. The method as claimed in claim 11, wherein the forming of the photoresist pattern includes a dry development process.

16. A method of forming a pattern, the method comprising:

forming an etching layer on a substrate;

forming a photoresist layer on the etching layer; wherein the photoresist layer includes one of a material that generates a hydroxyl group, a carboxylic acid group, or an amine group upon selective exposure to light and post-exposure baking and a material that includes a hydroxyl group, a carboxylic acid group, or an amine group and that loses the hydroxyl group, carboxylic acid group, or amine group by crosslinking upon selective exposure to light and post-exposure baking;

selectively exposing the photoresist layer to light to define an exposed area and an unexposed area in the photoresist layer;

forming a hardmask layer including a metal oxide or metal nitride on the photoresist layer using a selective deposition process such that:

when the photoresist layer includes the material that generates a hydroxyl group, a carboxylic acid group, or an amine group upon selective exposure to light and post-exposure baking, the hardmask layer including the metal oxide or metal nitride is formed on the exposed area and is not formed on the unexposed area, and when photoresist layer includes the material that includes a hydroxyl group, a carboxylic acid group, or an amine group and that loses the hydroxyl group, carboxylic acid group, or amine group by crosslinking upon selective exposure to light and post-exposure baking, the hardmask layer including the metal oxide or metal nitride is formed on the unexposed area, and is not formed on the exposed area;

partially removing the photoresist layer using the hardmask layer as an etch mask and forming a photoresist pattern; and etching the etching layer using the photoresist pattern as an etch mask and forming a fine pattern, wherein the selective deposition process includes providing a metal compound to the photoresist layer, the metal compound reacting with a hydroxyl group, a carboxylic acid group, or an amine group of the exposed area or unexposed area to selectively deposit metal.

17. The method as claimed in claim 16, wherein the selective deposition process includes providing a titanium compound to the photoresist layer, the titanium compound being a compound that reacts with a hydroxyl group, a carboxylic acid group, or an amine group of the exposed area or unexposed area to selectively deposit titanium on the surface of the photoresist layer.

18. The method as claimed in claim 17, wherein:

titanium compound is tetrakis-dimethyl-amino-titanium, and the method further includes providing $O_3$ to the photoresist layer.

19. The method as claimed in claim 16, wherein the selective deposition process includes providing a hafnium compound to the photoresist layer, the hafnium compound being a compound that reacts with a hydroxyl group, a carboxylic acid group, or an amine group of the exposed area or unexposed area to selectively deposit hafnium on the surface of the photoresist layer.

20. The method as claimed in claim 19, wherein:

the hafnium compound is $Hf[C_5H_4(CH_3)]_2(CH_3)_2$ or $Hf[C_5H_4(CH_3)]_2(OCH_3)CH_3$, and the method further includes providing $O_3$ to the photoresist layer.

* * * * *